United States Patent [19]

Dlugos et al.

[11] 4,047,007

[45] Sept. 6, 1977

[54] CLOCKED DIGITAL COUNTING SYSTEM

[75] Inventors: Daniel F. Dlugos, Huntington; Flavio M. Manduley, Seymour, both of Conn.

[73] Assignee: Pitney-Bowes, Inc., Stamford, Conn.

[21] Appl. No.: 715,882

[22] Filed: Aug. 19, 1976

[51] Int. Cl.² .................. G01G 3/00; H03K 21/00
[52] U.S. Cl. .................. 235/151.33; 177/25; 340/347 P; 235/151.31; 235/92 WT; 328/41
[58] Field of Search ........... 235/151.33, 151.3, 151.31, 235/92 WT; 340/347 P; 177/25, DIG. 3; 328/41

[56] References Cited

U.S. PATENT DOCUMENTS

| | | | |
|---|---|---|---|
| 3,487,399 | 12/1969 | Wogatzke | 340/347 P |
| 3,665,169 | 5/1972 | Henderson et al. | 177/25 X |
| 3,763,362 | 10/1973 | Griem, Jr. | 235/151.31 |
| 3,913,095 | 10/1975 | Dlugos | 340/347 P |
| 3,927,309 | 12/1975 | Fujiwara et al. | 235/151.31 |
| 3,973,109 | 8/1976 | Foster | 177/DIG. 6 X |
| 3,997,769 | 12/1976 | Hansmann | 235/151.33 X |

Primary Examiner—Edward J. Wise
Attorney, Agent, or Firm—Robert S. Salzman; William D. Soltow, Jr.; Albert W. Scribner

[57] ABSTRACT

A system for processing cyclic signal pairs generated by an optical transducer to provide an accurate measurement of the displacement of one member with respect to a reference is suitable for determining weight by measuring spring scale tare deflection. The system includes a pair of comparator Schmitt trigger circuits for shaping pulse waveform signals. The pulse signals are processed by fully clocked digital circuits including edge discriminators to generate multiple count pulses which are processed by combination logic for direction determination. Further processing includes sign determination (positive-negative) and zero identification circuits to provide up and down pulses which are filtered and fed to up/down counter stages. Counter stage information is decoded for feedback control and processing logic indication. The zero identification circuit facilitates an unambiguous zero reference indication by skipping one count at zero to provide a display sign change indication on either side of zero prior to incrementing display counts to better define true zero as an edge or line between successive displays rather than as a zone. In an alternate embodiment, zero transition indicators are provided by feeding the count pulses directly to an updown counter and utilizing the most significant counter bit to invert the counter outputs upon a transition through actual zero.

9 Claims, 7 Drawing Figures

CLOCKED DIGITAL COUNTING SYSTEM

RELATED APPLICATIONS

The present invention relates to a digital counting system suitable for processing output signals of photodetector pairs which sense the passage of moire fringes in a weight measuring environment such as that disclosed in the following copending applications, all owned by the assignee of the present invention: Weighing with Moire Optoelectronic Transducer, Ser. No. 653,850, filed Jan. 30, 1976; Leaf Spring Weighing Scale with Optical Detector, Ser. No. 655,393, filed Feb. 5, 1976; and Zero Load Adjustment Apparatus for Spring Weighing Scale, Ser. No. 669,528, filed Mar. 23, 1976, and more specifically to a fully clocked digital circuit employable in the invention entitled Counting System filed simultaneously herewith and owned by the assignee of the present invention.

BACKGROUND OF THE INVENTION

1. Field of the Invention

This invention relates generally to counting systems and more specifically to a counting system employing fully clocked digital circuits for processing cyclic waveforms to provide display and/or displacement indicative signals suitable for subsequent processing.

2. Brief Description of the Prior Art

Various devices have been proposed heretofore for the purpose of determining the position of a movable element by processing pulse signal outputs of an electro-optical transducer. Examples of such prior devices are illustrated in U.S. Pat. Nos. 2,886,717 and 3,487,399.

Earlier signal processing and counting systems employed RC networks which were time and temperature dependent and did not provide well defined pulse widths. Additionally, these systems were highly susceptible to both internal and external noise which resulted in generally poor reliability.

Further, an adjunct of most counting systems was the provision of an optical numerical readout indicative of the measured displacement of the movable element. Various problems were encountered when the movable element was returned to its reference position due to conventional counting system number display representation of the count. In prior counter-display arrangements, the display decremented in various fashions. For example, in one conventional display circuit the display decremented in the following manner: 2, 1, 0, −1, −2, −3 etc.; another conventional counting arrangement decremented in the following fashion: 3, 2, 1, 0, 9999, 9998, 9997, etc.

In the first instance, true zero actually was the transition edge between a display of 0 on one side and a display of −1 on the other, while in the second instance true zero was the transition edge between a display of 9999 on one side and 0 on the other side. In both of these prior systems, zero was difficult to reconcile by an operator attempting to calibrate the system as a true unambiguous edge between two displays rather than at the 0 display itself. Thus, in prior counting system human understanding and appreciation with respect to calibration and display interpretation was hampered by inherent display-counting system limitations.

SUMMARY OF THE INVENTION

In compendium, the invention comprises fully clocked digital circuits for processing and counting a pair of electro-optically generated cyclic analog waveforms. The waveforms are transduced from the movement of a moire fringe pattern generated as an optically amplified function of the displacement of one member with respect to a reference. The counting system measures the displacement and/or a function dependent of such displacement. Each analog waveform is generated by a photodetector pair arranged so that one photodetector provides a bias for the other.

The waveform signals are first shaped to provide digital pulse signals which are then processed for edge discrimination to generate multiple count pulses. A first combination logic circuit decodes the multiple pulses to provide displacement direction information. A clocked digital circuit generates delayed up and down pulses which are received by an up/down counter circuit.

The counting system further includes a sign determination (+ −) steering circuit and a zero identification which masks one incrementing count signal when the displaced member passes through the reference or zero point. With one count signal masked at zero, the counter and display skip a single numerical increment on both sides of zero.

Alternately, the direction decoded pulse waveforms of the first combination logic are received at an up/down counter array. The most significant counter bit serves to cause an inversion of the counter outputs when the count passes through zero by switching EXCLUSIVE OR gates which interconnect the remaining counter bits and a decoder. Thus, an indicator other than an integer may be provided as a first indicator upon incrementing from zero in either direction.

From the above summary, it can be appreciated that it is an object of the present invention to provide a counting system of the general character described adapted for processing a pair of cyclic waveforms generated by displacement of an element for determining the direction and magnitude of such displacement, which system is not subject to the disadvantages aforementioned.

It is a further object of the present invention to provide a counting system of the general character described which is adapted for use in conjunction with a spring scale for determining the weight of a load as a function of scale tare deflection.

Another object of the present invention is to provide a counting system of the general character described which is relatively insensitive to both internally and externally generated noise.

It is a further object of the present invention to provide a spring scale having an electro-optical transducer which generates a pair of cyclic waveform signals indicative of scale tare displacement in combination with fully clocked digitial processing circuits for determining the weight of a scale load.

Another object of the present invention is to provide a fully clocked digital counting system of the general character described which is free of time induced error.

Yet a further object of the present invention is to provide a fully clocked digital counting system of the general character described which is free of temperature induced error.

Still another object of the present invention is to provide a counting system of the general character described wherein cyclic waveforms are shaped for processing by fully clocked digital circuits for count direction determination.

With these ends in view the invention finds embodiment in certain combinations of elements, arrangements of parts and series of steps by which the objects aforementioned and certain other objects are hereinafter attained, all as fully described with reference to the accompanying drawings and the scope of which is more particularly pointed out and indicated in the appended claims.

BRIEF DESCRIPTION OF THE DRAWINGS

In the accompanying drawings in which are shown some of the various possible exemplary embodiments of the invention.

DESCRIPTION OF THE PREFERRED EMBODIMENTS

The present invention relates to a system for processing a pair of electro-optically generated waveforms which are functions of the displacement of a control member, e.g. a tare of a spring scale, to count and measure both the magnitude and direction of such displacement.

The system includes wave shaping circuits for each waveform, pulse edge discriminating circuits and a first combination logic for determining the direction of count, i.e. increasing or decreasing. Further circuitry provides sign determination and zero identification functions. The zero identification circuit masks a single input to the counter when incrementing from zero such that one bit of the counter is occupied by a sign change indication rather than a numerical increment. Thus, zero displacement is optically displayed as a true edge or line between a plus and a minus sign change display.

Figure 1:
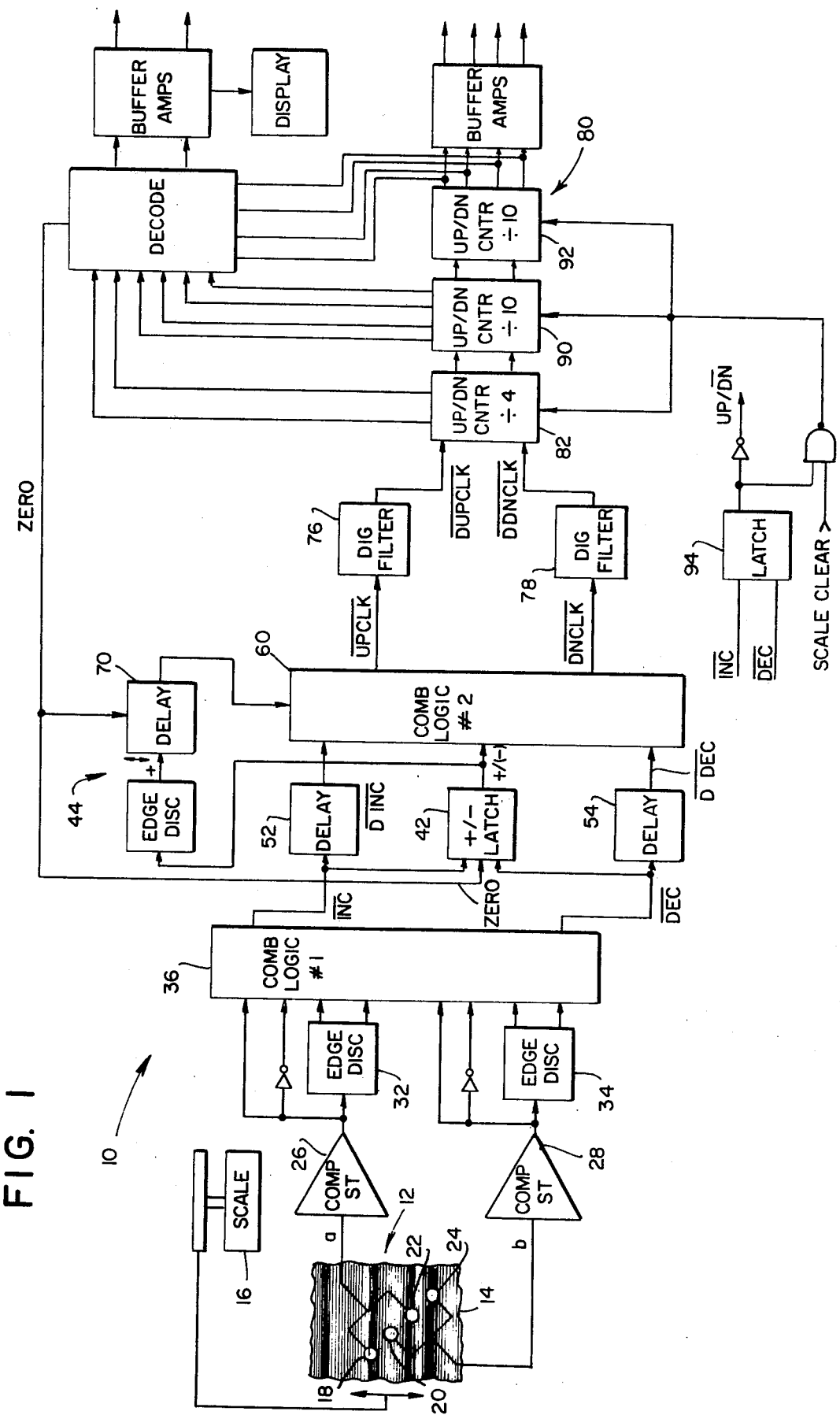
FIG. 1 is a schematized block diagram of a scale and counting system constructed in accordance with and embodying the present invention and showing an optical fringe pattern movable over a photodetector array for the purpose of generating a pair of waveform signals which are processed in accordance with the present invention to determine the weight of a load.

Referring now in detail to the drawings, the reference numeral 10 in FIG. 1 denotes generally a counting system constructed in accordance with and embodying the invention. The system 10 is adapted to process electro-optically transduced signals generated by a transducer 12 upon which a periodic fringe pattern 14 is projected. The fringe pattern 14 may comprise a moire pattern optically coupled to a tare of a spring scale 16 such that the fringe pattern moves as an optically amplified function of scale tare displacement as more fully set forth in the foregoing copending related applications. It should be appreciated, however, that the present invention is well adapted for the processing of cyclic signals generated in any counting environment.

Figure 3:
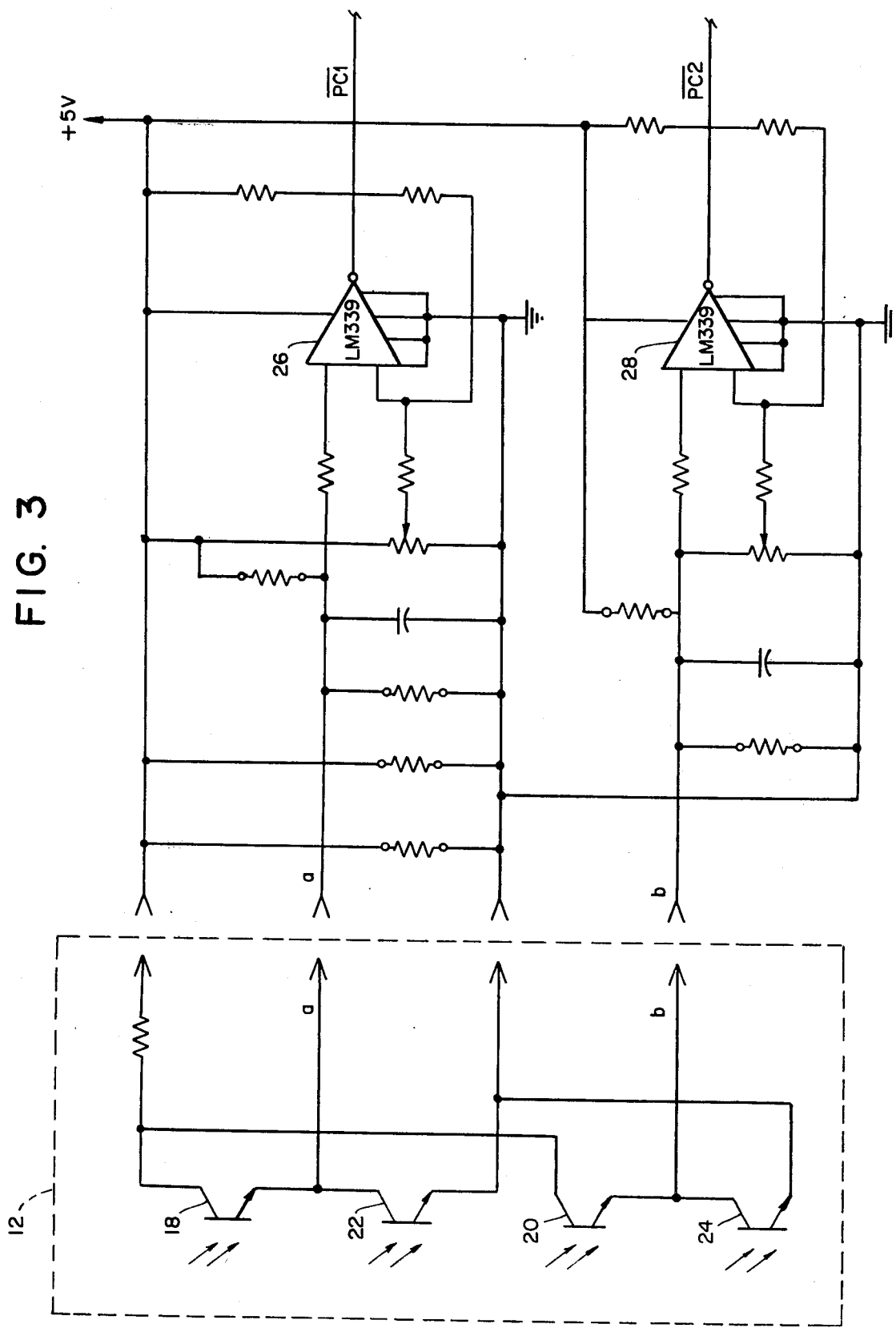
FIG. 3 is a schematic diagram illustrating a photocell array of an electro-optical transducer which generates a pair of waveform signals and an analog to digital converter which provides corresponding pulse waveforms.

The transducer 12 comprises four phototransistors 18, 20, 22 and 24, all having similar operating characteristics. From an observation of FIG. 3, it will be appreciated that the transistor 18 is coupled between a positive potential and the collector electrode of the transistor 22. Similarly, the transistor 20 is coupled between a positive potential and the collector electrode of the transistor 24. Thus, the transistors 18 and 20 provide a bias for the photoresistors 22, 24, respectively, in lieu of conventional biasing resistors.

The biasing or compensating transistors 18, 20 increase the range of output voltage for the transistors 22, 24 and provide compensation for changes in source radiation, atmospheric conditions, temperature changes, etc., which affect the biasing and biased phototransistors simultaneously. Thus, a dynamic bias is provided which maintains the operating characteristics of the transistors 22, 24 in a manner similar to that disclosed in U.S. Pat. No. 3,913,095 issued Oct. 14, 1975 to Dlugos and assigned to the assignee of the present invention.

Figure 2:
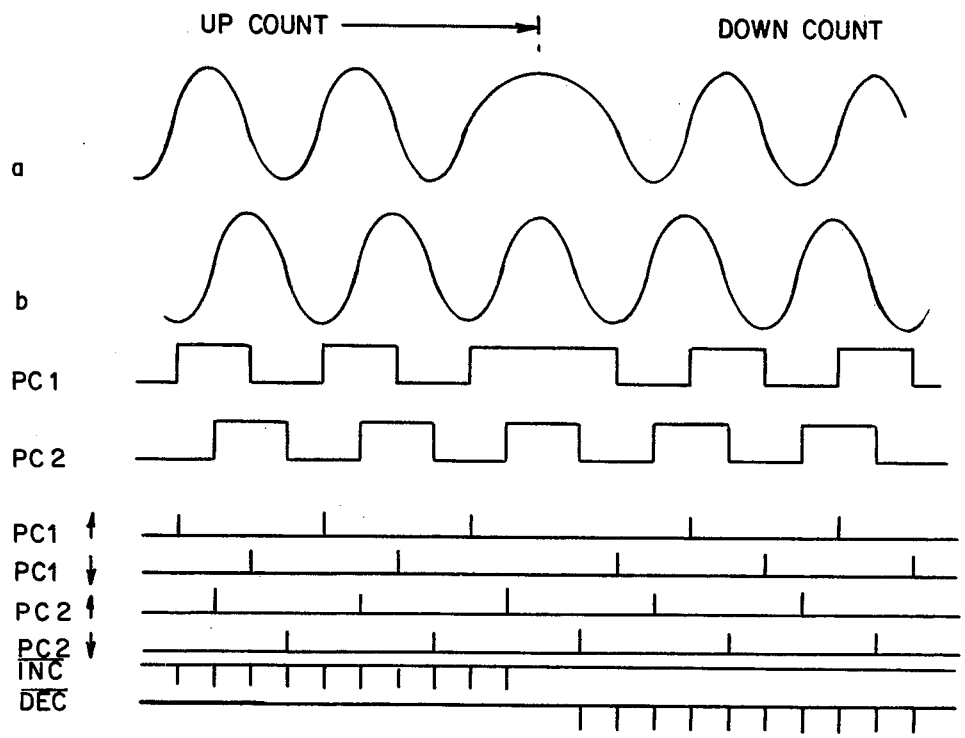
FIG. 2 is a waveform timing diagram of initial interface circuits of the counting system.
Figure 4:
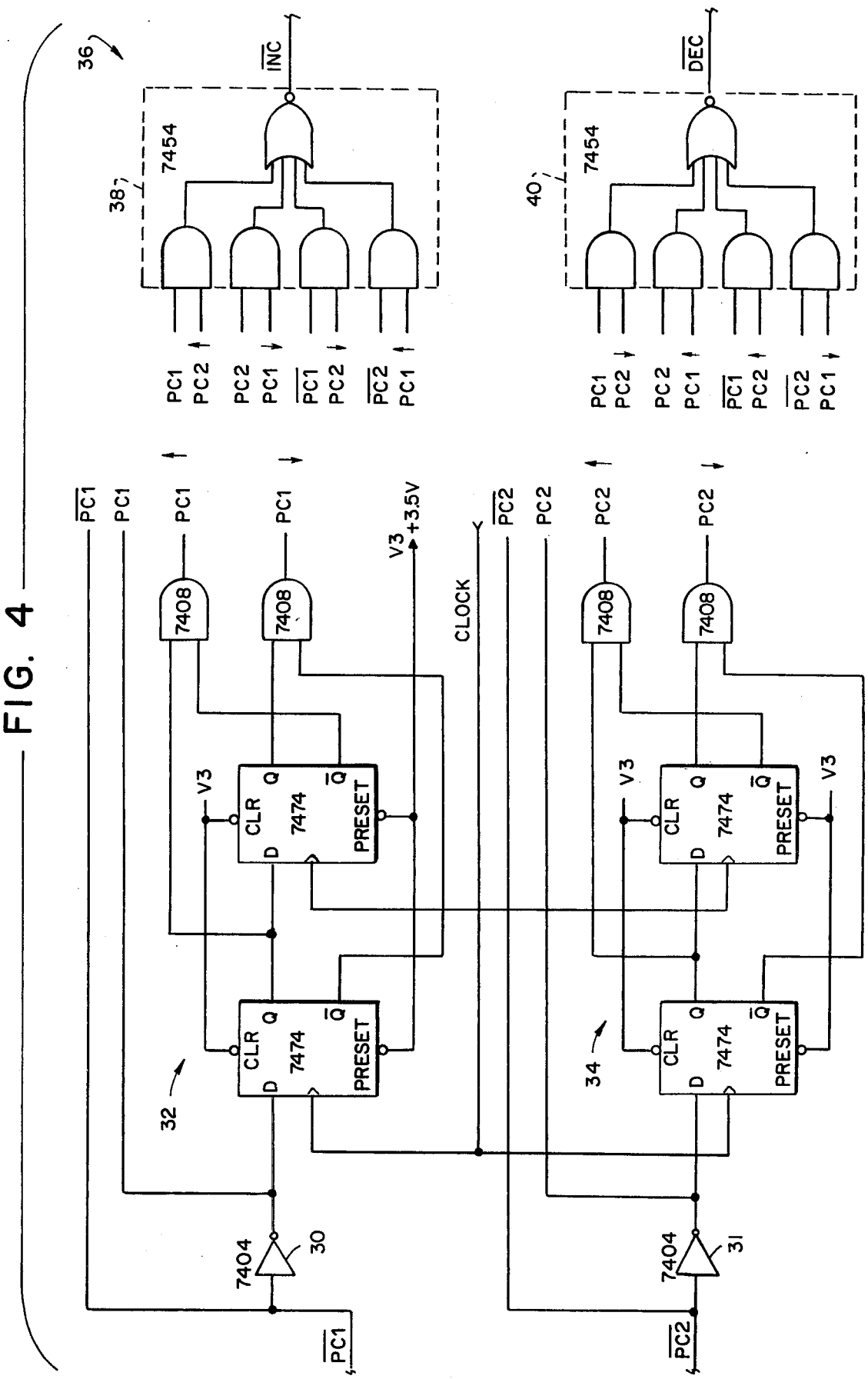
FIG. 4 is a schematic diagram of edge discriminating circuits which provide multiple counts from the pair of pulse waveforms and further shows a first combination logic which decodes direction determinative information.

Movement of the fringe pattern 14 across the phototransistor array provides substantially sinusoidal cyclic waveform outputs designated waveform $a$ and waveform $b$ in FIG. 2 from the collectors of the transistors 22, 24, (FIGS. 1 & 3) respectively. Each of the analog waveforms $a$ and $b$ are fed to a linear voltage comparator Schmitt trigger inverter 26, 28, (FIGS. 1 & 3) respectively, to generate a pulse waveform designated $\overline{pc1}$ and $\overline{pc2}$, respectively. A pair of inverters 30, 31 (FIG. 4) provide inverse waveforms pc1 and pc2, respectively, from the signals $\overline{pc1}$ and $\overline{pc2}$.

In accordance with the invention, subsequent circuitry comprises fully clocked digital components to thus provide accuracy and reliability which is noise insensitive and not affected by time or temperature variations. A system clock 33 (FIG. 5) provides a timing or CLOCK signal having circuitry triggering pulses of a frequency which is higher than the maximum $a$ and $b$ waveform frequency and includes at least one pulse for each $a$ or $b$ wave. The CLOCK signal thus filters component actuation by random noise signals.

The waveforms pc1 and pc2 are edge discriminated at a pair of edge discriminators 32 and 34, (FIG. 5) respectively, to provide a pulse waveform pc1 ↑ (indicating a positive going edge of pc1) and a waveform pc1 ↓ (indicating a negative going edge of pc1). Similarly, the edge discriminator 34 provides a waveform pc2 ↑ and a waveform pc2 ↓ indicating positive and negative going edges of the waveform pc2. The edge discriminators 32, 34 each comprise a pair of fully clocked D-Type edge-triggered flip-flops operating as shift registers and providing a multiplication by four, i.e. four pulses for each cycle of the fringe pattern. Decoding of the flip-flop outputs by a pair of AND gates provides the transition waveforms pc1 ↑, pc1 ↓, pc2 ↑ and pc2 ↓.

The digital waveforms thus generated are decoded at a first combination logic 36 (FIGS. 1 & 4) which comprises a pair of expandible 4 wide 2 input AND OR invert gates 38, 40, respectively. The combination logic 36 decodes for count direction information to provide inverse pulse waveform signals $\overline{INC}$ and $\overline{DEC}$ indicative of increasing and decreasing scale tare displacement, respectively.

With reference now to the waveform timing diagram of FIG. 2, the waveforms a and b are shown progressing first through an up count and then through a down count. The corresponding digital signals pc1 and pc2, inverted from the voltage comparator Schmitt triggers 26, 28, the edge discriminated signals, and the signals $\overline{INC}$ and $\overline{DEC}$ are also depicted. It will be appreciated that the combination logic 36 generates the displacement direction decoded signals $\overline{INC}$ and $\overline{DEC}$ in accordance with the following equations:

$$\overline{(pc1)(pc2\uparrow)+(pc2)(pc1\downarrow)+(\overline{pc1})(pc2\downarrow)+(\overline{pc2})(pc1\uparrow)} = \overline{INC}$$

$$\overline{(pc1)(pc2\downarrow)+(pc2)(pc1\uparrow)+(\overline{pc1})(pc2\uparrow)+(\overline{pc2})(pc1\downarrow)} = \overline{DEC}$$

The increasing and decreasing waveforms $\overline{INC}$ and $\overline{DEC}$ respectively are each delayed for the purpose of permitting a sign steering circuit 42 (FIGS. 1 & 5) to examine the sign of the count with reference to zero displacement and further to permit a zero skip circuit 44 (FIGS. 1 & 5) to mask a single pulse when the count is incrementing from zero in either direction.

Figure 6:
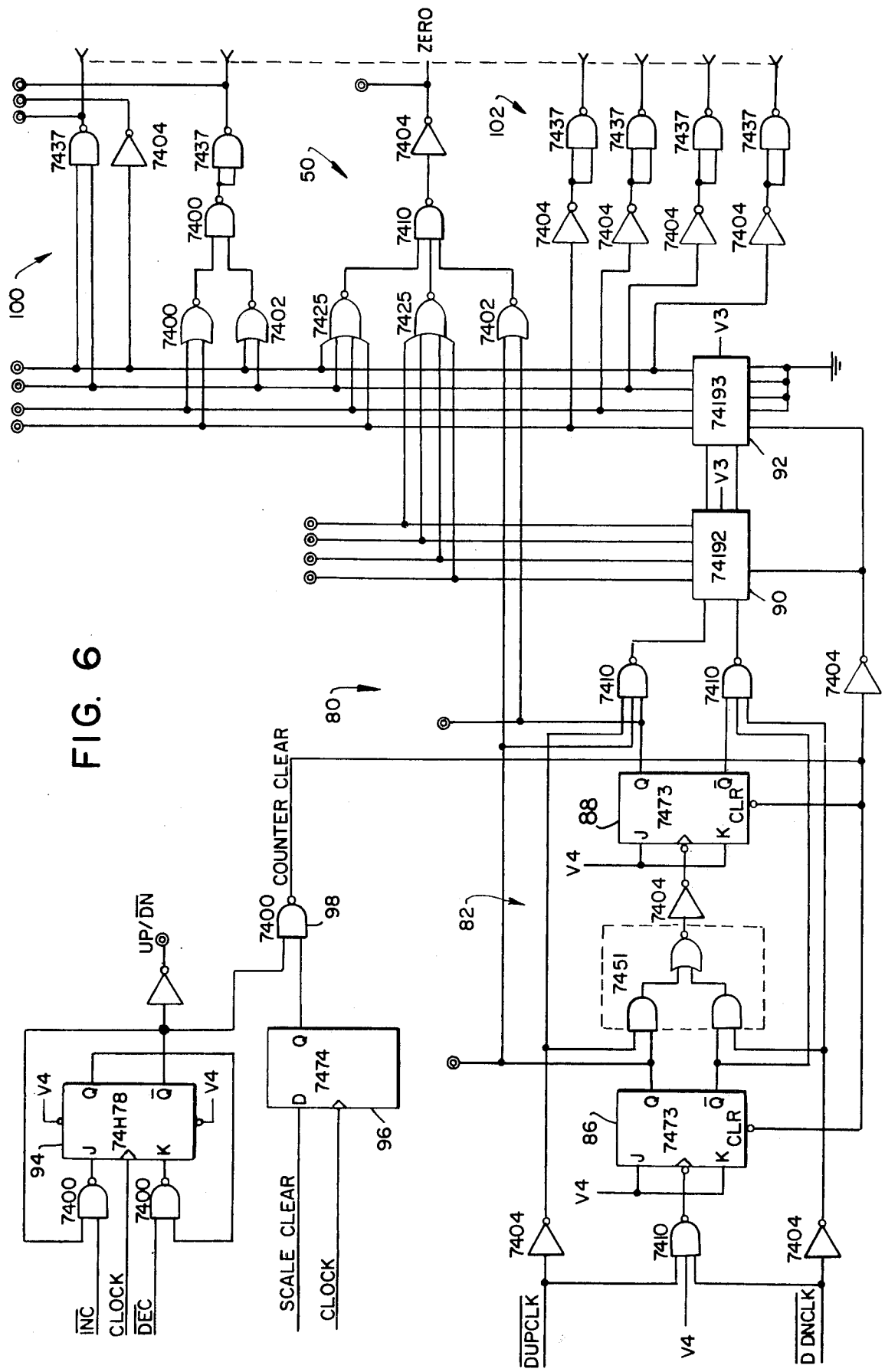
FIG. 6 is a schematic diagram illustrating cascade counting circuits and decoding logic for processing the counts to load weight indicative signals.

Both the sign steering circuit 42 and zero skip circuit 44 receives a ZERO feedback signal from a counting circuit zero decoding logic 50 (FIG. 6). The sign steering circuit 42 comprises a latch including a fully clocked, edge-triggered JK flip-flop 46 with the input comprising an AND gate receiving both the $\overline{INC}$ signal and the ZERO signal which acts as a toggle. The K input of the flip-flop 46 comprises an AND gate receiving both the $\overline{DEC}$ signal and the ZERO signal which acts as a toggle. Assuming a positive scale displacement, the output of the flip-flop 46 will indicate a positive (+) sign steering signal. The output will invert to a negative (−) sign signal only when the displacement passes through zero concurrently with a high $\overline{DEC}$ signal.

The delay of each of the signals $\overline{INC}$ and $\overline{DEC}$ is provided at a pair of quad D-Type flip-flops 52, 54 (FIG. 5), respectively, to provide delayed signals D INC and D DEC.

A pair of dual 2 wide and 2 input AND OR invert gates 56, 58 forming part of a second combination logic 60 receive the signals D INC and D DEC for decoding into count up and count down signals. An intermediate count up signal is decoded at the gate 56 and is further zero skip masked in accordance with the present invention. The count up zero masking signal is generated at the zero skip circuit 44 which includes an edge discriminator comprised of a pair of fully clocked quad D-Type edge-triggered flip-flops 64, 66 (FIG. 5) with the D input of the flip-flop 64 receiving the positive (+) sign steering signal. The outputs of the flip-flops 64, 66 are gated at a dual 2 wide 2 input AND OR invert gate 68 to provide a positive (+) sign steering transition waveform $+\uparrow\downarrow$.

Figure 5:
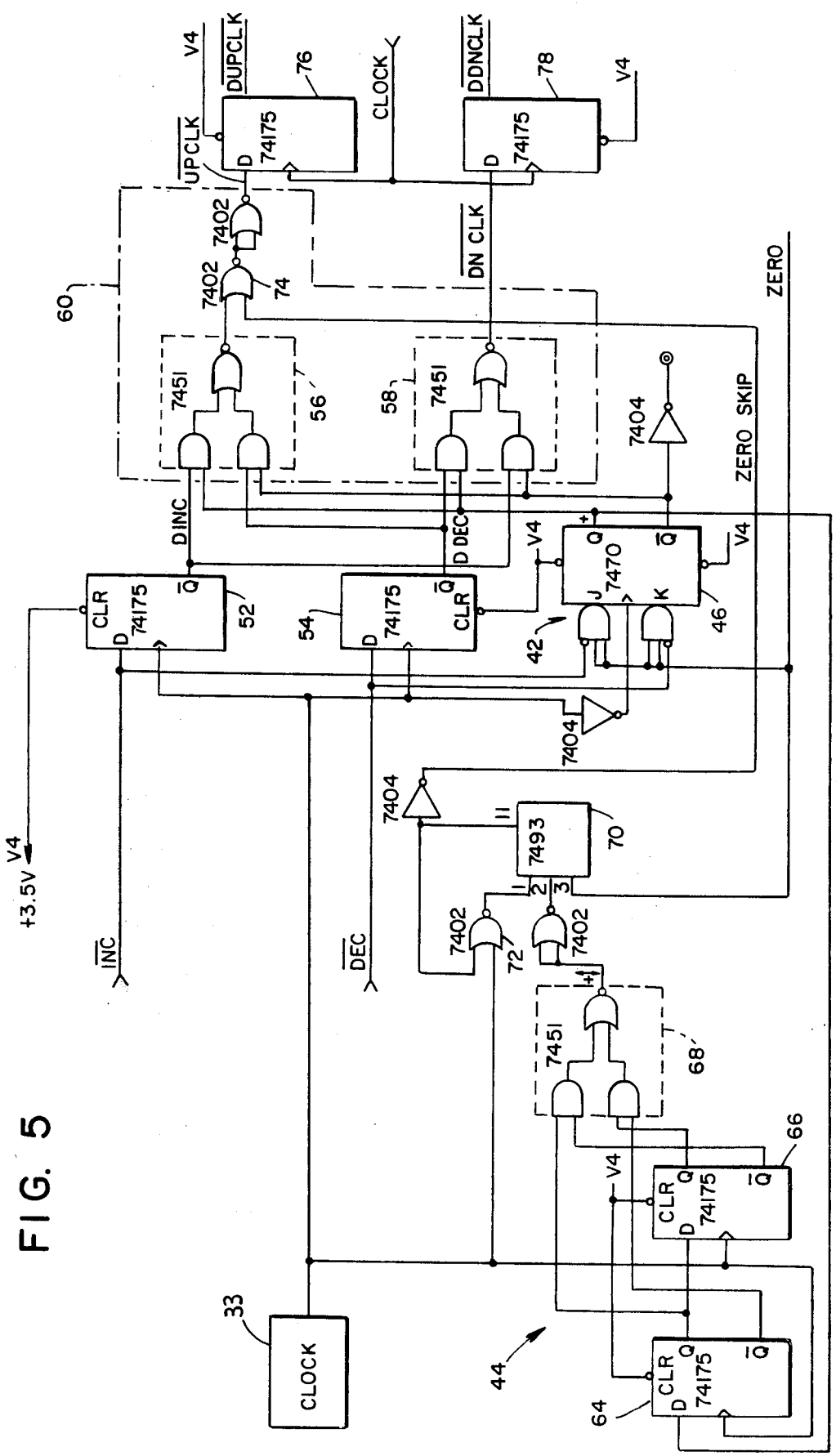
FIG. 5 is a schematic diagram of a sign determination steering circuit and a zero skip circuit which provides a single count skip when incrementing from zero; further illustrated is a second combination logic which generates delayed incrementing and decrementing counts with the incrementing counts being zero skip compensated.

A four bit counter (7493) designated 70 in FIGS. 1 and 5 is included in the zero skip circuit 44. The counter 70 is designed to function as a clocked digital one shot multivibrator and provide a zero skip output signal. A NOR gate 72 leading to the 1 input terminal of the counter receives both the clock pulse and a feedback of the counter output at terminal 11. The counter inputs (terminals 2 and 3) receive respectively the sign steering transition signal $+\uparrow\downarrow$ and the ZERO signal. These last mentioned inputs are internally NAND gated to reset the JK flip-flops of the counter 70.

It should be appreciated that with the counter output high, the output feedback through the NOR gate 72 prevents counter cycling although clock pulses are present at the gate 72. A concurrent pulse steering transition signal $(+\uparrow\downarrow)$ and a ZERO signal serve to reset the internal flip-flops of the counter 70 to provide a low signal at the counter output 11 and initiate counting sequence on the next clock pulse. The counter 70 is timed for an interval, e.g. four clock pulses, sufficient to mask one increasing count, i.e. one intermediate count up signal, at a sign change and then provides a high output which stops the counter 70.

The counter 70 output is inverted to provide the zero skip signal which is high during the counting cycle only and initiated at the transition sign change through ZERO. This zero skip signal is fed to a NOR gate 74 (FIG. 5) along with the intermediate up count signal from the gate 56. The NOR gate 74 is series connected to a further NOR gate, all forming part of the second combination logic 60 to provide the incrementing signal $\overline{UP\ CLK}$. Thus, the zero skip signal blanks a single pulse in the intermediate up count signal upon a displacement transition through zero. The blanking or masking effect is provided for up count signals which are incrementing either in a positive or a negative direction. The blanking zero skip signal lasts for the duration of a single up count cycle timed by the counter 70 until the counter cycles to a high output, providing a low zero skip signal at the gate 74 which permits further up count signals to pass.

The second combination logic provides $\overline{UP\ CLK}$ and $\overline{DN\ CLK}$ signals in accordance with the following equations:

$$\overline{(D\ INC)\ (+) + (D\ DEC)\ (-)} + \text{zero skip} = \overline{UP\ CLK}$$

$$(D\ DEC)\ (+) + (D\ INC)\ (-) = \overline{DN\ CLK}$$

The up count and down count signals $\overline{UP\ CLK}$ and $\overline{DN\ CLK}$ are each filtered at a digital filter 76, 78, (FIG. 5) respectively, each filter comprising a D-TYpe edge-triggered flip-flop which delays the respective signal to prevent a race condition from developing an erroneous count pulse.

The filtered up and down count signals $\overline{D\ UP\ CLK}$ and $\overline{D\ DN\ CLK}$ are thus provided for processing as inputs to an up/down counter array 80 (FIGS. 1 and 6).

With the $\overline{D\ UP\ CLK}$ signal automatically zero skip compensated, the counter 80 and its associated display skip one count when incrementing through zero. Thus, the display will pass through zero in the following sequence: 2, 1, +0, −0, −1, −2, etc. An individual calibaring a device using the counting system would immediately understand that true zero is the edge between −0 and −0 which are not incrementing integers.

It should be appreciated that the counter array 80 is exemplary of many possible variations and as hereinafter described has been designed for utilization in conjunction with the operating parameters of a leaf spring scale utilizing a moire fringe pattern optical detector. In such application, the scale spring constant and optical moire displacement amplification calibration provide a least significant bit indicative of a scale displacement produced by a weight increment of one fortieth of an ounce, however as heretofore mentioned the counting system of the present invention is adapted for application in numerous counting environments, and the particular decoding for weight indicative information is by way of example only.

The counter 80 includes a first counter stage 82 comprising a binary two bit up/down ripple counter 84. The signals D̄ UP CLK and D̄ DN CLK are fed through a NAND gate to toggle a first bit dual JK master slave flip-flop 86, (FIG. 6) the outputs of which are conventionally gated with the signals D UP CLK and D DN CLK to toggle a second bit flip-flop 88. The outputs of the flip-flops 86, 88 along with the UP CLK and DN CLK signals are further conventionally NAND gated to a second counter stage 90 comprising a four bit binary coded decimal counter whose outputs are fed to a third binary counter stage comprising a four bit up/down counter 92.

It should be appreciated that the outputs of the first stage 82 provides signals indicative of a scale tare displacement equivalent to the weight of a one-fortieth ounce load (first bit) and a one-twentieth ounce load (second bit) and the outputs of the second counter stage 90 (FIGS. 1 and 6) provide signals indicative of load displacements equivalent to weight increments of one tenth, two tenths, four tenths and eight tenths of an ounce, while the third counter stage outputs provide signals indicative of weights of 1, 2, 4 and 8 ounces.

In order to examine the direction of measured displacement, a latch 94 (FIG. 6) is provided comprising a dual JK master slave flip-flop which receives the signals ĪNC and D̄ĒC. The latch output is further utilized to provide a condition on clearing of the counter array 80. Thus, when the scale tare is oscillating about zero, a scale clear request, clock synchronized at a D flip-flop 96 is provided at a NAND gate 98 along with the Q̄ output of the latch 94 to provide a synchronous COUNTER CLEAR signal assuring that the counters will only clear in the +0 mode of displacement.

As heretofore mentioned, the binary to decimal decoder 50 provides the ZERO signal. A further binary to decimal decoder 100 (FIG. 6) provides signals indicating that the weight carried by the scale exceeds certain predetermined values, e.g., 2 ounces and 12 ounces, while a binary to decimal decoder 102 provides further outputs for display and processing purposes.

The specific counter circuits employed are merely exemplary, and the counting system of the present invention may find embodiment invarious systems wherein only binary counters are utilized in conjunction with a processor such as a microprocessor and further the microprocessor may be utilized to provide the effect of zero skip masking after counting and before display.

Figure 7:
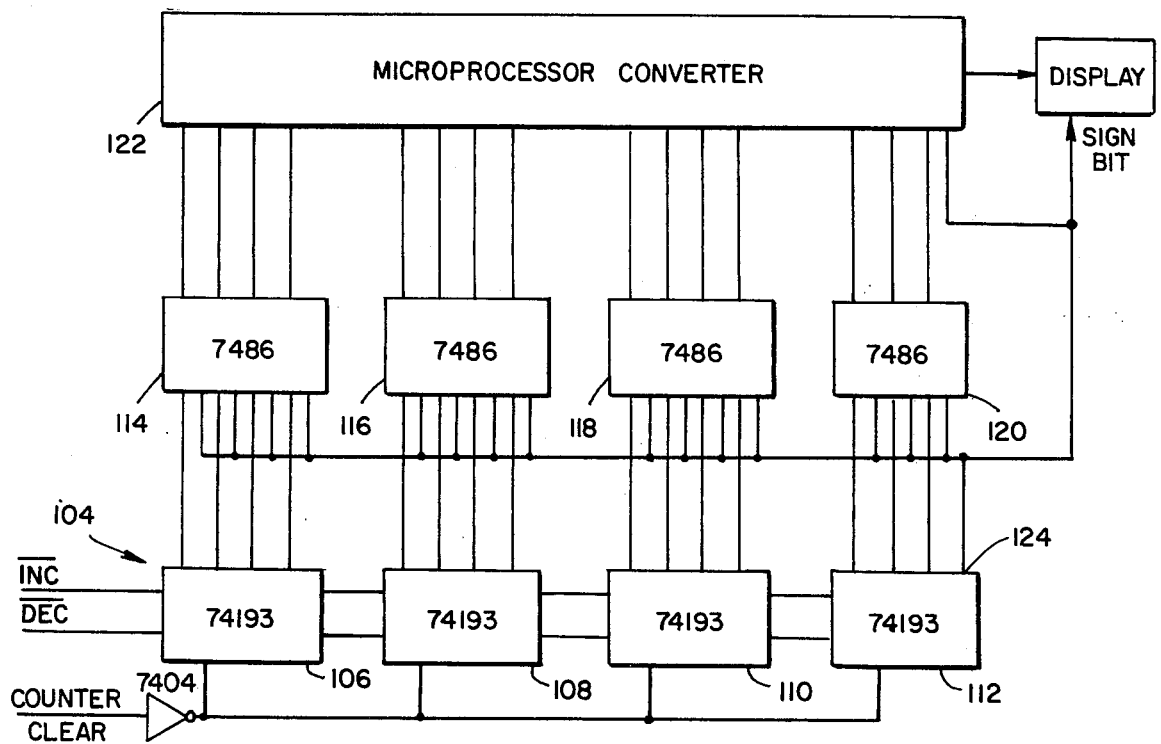
FIG. 7 is a schematic diagram illustrating an alternate embodiment wherein zero transition indicators are provided upon a transition from zero in either direction by inversion of the outputs of a counter array.

With reference now to FIG. 7 wherein an alternate embodiment of the invention is shown, the signals ĪNC and D̄ĒC produced at the first combination logic 36 (FIG. 1) are fed directly to a counter 104 comprising a series of binary four bit up/down ripple counters 106, 108, 110 and 112. The counters may be cleared by the synchronous COUNTER CLEAR signal generated in the manner previously described.

This embodiment differs from the embodiment previously disclosed in that moninteger zero transition indicators are provided upon a transtion from zero in either direction without compensating (masking) the ĪNC signal to the counter 104.

The bit outputs of each counter stage 106, 108, 110 and 112 are fed through a quad EXCLUSIVE OR gate 114, 116, 118 and 120, respectively, to a binary to binary coded decimal trade unit converter 122 which includes hardware or software in a microprocessor and which is programmed to convert the counter outputs into signals indicative of the measured displacement in appropriate units. Such signals are suitable for display or further processing.

It should be appreciated that a highest order bit output of the counter 104, i.e. a bit output 124 of the counter stage 112, provides a steering signal to switch the EXCLUSIVE OR gates 114, 116, 118 and 120.

In operation, assuming a decrementing count through zero, when the displacement passes the actual zero transition edge, all counter bit outputs go high including the highest order bit output 124. A high signal at the bit output 124 provides a high steering signal which immediately switches the EXCLUSIVE OR gates 114, 116, 118 and 120 without further input counts to provide an inversion of the present high counter bit outputs which would otherwise be transmitted through the gates to the converter 122. The converter now recognizes the one's complements off all counter bits including the zero count.

The counter capacity is such that the highest order bit is unnecessary as a numerical count and does not required complementing so it is not transmitted to the converter 122 through the EXCLUSIVE OR gates along with the other counter bits but is connected directly. Because the counter information observed by the converter 122 will be identical for similar counts in opposite sides of the zero edge, the highest order bit is utillized to provide a sign bit or signal to indicate a positive or negative count for display.

A truth table of actual counts and counter bit information observed by the converter 122 upon a count down through zero would appear as follows:

|  | | | | |
|---|---|---|---|---|
| 1 | 1000 | 0000 | 0000 | 0000 |
| 0 | ⎡ 0000 | 0000 | 0000 | 0000 ⎤ |
| ZERO EDGE | ⎣ 1111 | 1111 | 1111 | 1111 ⎦ |
| −0 | 0000 | 0000 | 0000 | 0000 |
| −1 | 1000 | 0000 | 0000 | 0000 |

It will be appreciated that the zero edge with all counter bits high is an unstable state and the steering signal of the highest order bit immediately switches the EXCLUSIVE OR gates 114, 116, 118 and 120 to provide the one's complement of incrementing counts in a negative direction. Further, the highest order bit may assign a sign or direction indication, e.g a plus and/or a minus sign, a direction arrow, etc., to the zero and successive incrementing displays which will appear after the zero edge upon further incrementing counts in either direction. The zero indicator with its associated direction indicator is considered a noninteger indicator of the transition thrugh the true zero. In calibrating the system true zero would be recognized as the edge between the two noninteger displays.

Thus, it will be seen that there is provided a counting system which achieves the various objects of the present invention and is well suited to meet the conditions of practical use.

As various changes might be made in the counting system as above set forth, it is to be understood that all matter herein described or shown in the accompanying drawings is to be interpreted as illustrative and not in a limiting sense.

Having thus described the invention, there is claimed as new and desired to be secured by Letters Patent:

1. A system for processing cyclic waveforms generated as a function of the change of a bidirectionally variable parameter whose change is to be measured with respect to a reference, the system comprising digital wave shaping means, the digital wave shaping means receiving the cyclic waveforms and in response thereto providing a pair of shaped digital waveforms, clock means, the clock means providing a pulsed timing signal the frequency of which is greater than the maximum frequency of the cyclic waveforms, sensing means, the sensing means receiving the shaped waveforms and the timing signal and in response thereto determining the direction of a variation of the parameter and providing one series of pulses indicative of a variation in one direction and another series of pulses indicative of a variation in an opposite direction, counting means disposed in the system and coupled to the sensing means to receive either one of said series of pulses and the timing signal and in response thereto being adapted to add the pulses of the one series or to subtract the pulses of the other series to provide signals indicative of a measure of the variation in the parameter and processing means electrically connected within the system for receiving said signals and in response thereto providing an indication of the change of the bidirectionally variable parameter with respect to the reference, whereby reliable noise insensitive processing is provided.

2. A system constructed in accordance with claim 1 further including count masking means disposed in the system, the masking means being electrically coupled to the one series of pulses and the timing signal and adapted to block a signal pulse of the one series for a predetermined series of cycles of the timing signal at the instance when the variation increments from the reference, whereby an indication indicating an initial change from the reference to facilitate zero calibration of the system at the true reference level is provided.

3. A system constructed in accordance with claim 2 further including sign steering means disposed in the system, the steering means being electrically coupled to both series of pulses and the timing signal and being adapted to provide a steering signal indicative of the direction of the variation with respect to the reference, the processing means including means providing a signal indicative of a null variation with respect to the reference, and means actuating the masking means, the actuating means being coupled to the null signal and being responsive to a concurrent change in the steering signal with the presence of the null signal.

4. A system constructed in accordance with claim 3 further including delay means disposed in the system, the delay means coupling the sensing means and the counting means, the delay means receiving either one of said series of pulses and the timing signal and in response thereto delaying the last mentioned series of pulses a period sufficient to permit synchronization between the count masking signal and the series of pulses received at the counting means.

5. A system constructed in accordance with claim 1 further including filter means disposed in the system, the filter means coupling the counting means and the processing means, the filter means receiving the signals indicative of a measure of the variation and the timing signals and in response thereto delaying the signals indicative of the measures of the variation, whereby erroneous signals indicative of the measure of variation are suspressed.

6. A system constructed in accordance with claim 1 further including a display, the processing means providing signals for actuation of the display, the display providing a visual measure of the change of the bidirectionally variable parameter with respect to the reference.

7. A system constructed in accordance with claim 6 wherein the processing means further includes means providing a display indication other than an integer as an initial indication when the variation increments from the reference.

8. A spring scale adapted to measure the weight of a load as a function of the deflection from a fixed reference of a tare adapted to carry the load, the scale comprising means operatively interconnecting the scale tare and the reference and adapted to generate an optical cyclic pattern, the generating means including means moving the pattern as a function of the scale tare deflection from a no load position, optoelectronic transducer means, the pattern being projected upon the transducer means, the transducer means generating a pair of cyclic waveforms as a function of the deflection of the tare, and a system for processing the cyclic waveforms to provide a determination of the weight of a load carried by the tare, the system including digital wave shaping means, the digital wave shaping means receiving the cyclic waveforms and in response thereto providing a pair of shaped digital waveforms, clock means, the clock means providing a pulsed timing signal the frequency of which is greater than the maximum frequency of the cylic waveforms, sensing means, the sensing means receiving the shaped waveforms and the timing signal and adapted to sense the direction of the tare movement and to provide one series of pulses indicative of movement in one direction and another series of pulses indicative of movement in an opposite direction, counting means coupled to the sensing means to receive either one of said series of pulses and the timing signal and in response thereto being adapted to add the pulses of the one series or to subtract the pulses of the other series to provide signals indicative of the measure of tare movement, and processing means receiving said signals indicative of the measure of tare movement and adapted to provide a load weight determinative indication corresponding to the steady state tare deflection.

9. A scale constructed in accordance with claim 8 further including count masking means disposed in the system, the masking means being electrically coupled to the one series of pulses and the timing signal and adapted to block a single pulse of one series from the counting means for a predetermined series of cycles of the timing signal at the instance when the tare deflects from the no load position, whereby an indication other than an integer may be provided upon an initial tare deflection from the no load position.

* * * * *

UNITED STATES PATENT AND TRADEMARK OFFICE
CERTIFICATE OF CORRECTION

PATENT NO. : 4,047,007
DATED : September 6, 1977
INVENTOR(S) : Daniel F. Dlugos - Flavio M. Manduley It is certified that error appears in the above-identified patent and that said Letters Patent are hereby corrected as shown below:

Column 4, line 21, change "photoresistors" to -- phototransistors --.

Column 5, line 36, before the word "input" insert -- J --.

Column 6, line 49, change "D-TYpe" to -- D-Type --.

Column 6, line 63, change first occurrence of "-0" to -- +0 --.

Column 7, line 67, change "moninteger" to -- noninteger --.

Column 8, line 54, change "indication" to -- indicator --.

Column 8, line 60, change "thrugh" to -- through --.

Claim 2, column 9, line 38, change "signal" to -- single --.

Signed and Sealed this

Third Day of July 1979

[SEAL]

Attest:

Attesting Officer

LUTRELLE F. PARKER
Acting Commissioner of Patents and Trademarks